US005617054A

United States Patent [19]
Koifman et al.

[11] Patent Number: 5,617,054
[45] Date of Patent: Apr. 1, 1997

[54] SWITCHED CAPACITOR VOLTAGE ERROR COMPENSATING CIRCUIT

[75] Inventors: Vladimir Koifman, Rama-Gan; Yachin Afek, Kfar Saba, both of Israel

[73] Assignee: Motorola, Inc., Schaumburg, Ill.

[21] Appl. No.: 572,318

[22] Filed: Dec. 14, 1995

[30] Foreign Application Priority Data

Nov. 23, 1994 [GB] United Kingdom .................... 9423631

[51] Int. Cl.[6] ...................................... G06G 7/12
[52] U.S. Cl. .......................... 327/362; 327/337; 327/378; 330/9
[58] Field of Search ................................ 327/362, 378, 327/307, 336, 337, 554, 561, 563, 91, 94, 52, 54, 341; 330/9

[56] References Cited

U.S. PATENT DOCUMENTS

| | | | |
|---|---|---|---|
| 3,473,043 | 10/1969 | James | 327/362 |
| 3,988,689 | 10/1976 | Ochi et al. | 330/9 |
| 4,323,852 | 4/1982 | Walker | 330/9 |
| 4,584,532 | 4/1986 | Duehren et al. | 327/554 |
| 4,833,418 | 5/1989 | Quintus et al. | 330/9 |
| 5,124,593 | 6/1992 | Michel | 327/554 |
| 5,132,609 | 7/1992 | Nguyen | 330/9 |
| 5,258,664 | 11/1993 | White | 327/91 |
| 5,264,804 | 11/1993 | Fox | 327/362 |
| 5,291,074 | 3/1994 | Nayebi | 327/96 |
| 5,498,986 | 3/1996 | Manlove | 327/337 |
| 5,508,656 | 4/1996 | Jaffard et al. | 330/9 |
| 5,539,356 | 7/1996 | Arntz | 327/362 |

FOREIGN PATENT DOCUMENTS 2195068  10/1986  United Kingdom .
2202400   3/1987  United Kingdom .

Primary Examiner—Timothy P. Callahan
Assistant Examiner—My-Trang Nu Ton
Attorney, Agent, or Firm—Robert D. Atkins

[57] ABSTRACT

A compensating circuit (8) is used with a switched capacitor circuit (10) which includes a switched capacitor arrangement (12) and an op-amp (1) having a first input (14) coupled to a switched capacitor (11), a second input and an output (16). A sampling circuit (19,17,23) samples an error signal at the first input (14) of the op-amp (1) and an amplifier (15) coupled to receive the sampled error signal provides a compensation signal in dependence upon the sampled error signal. The compensation signal provides an offset signal for the second input of the op-amp (1), such that propagation of the error signal to the output (16) of the op-amp (1) is substantially reduced.

6 Claims, 1 Drawing Sheet

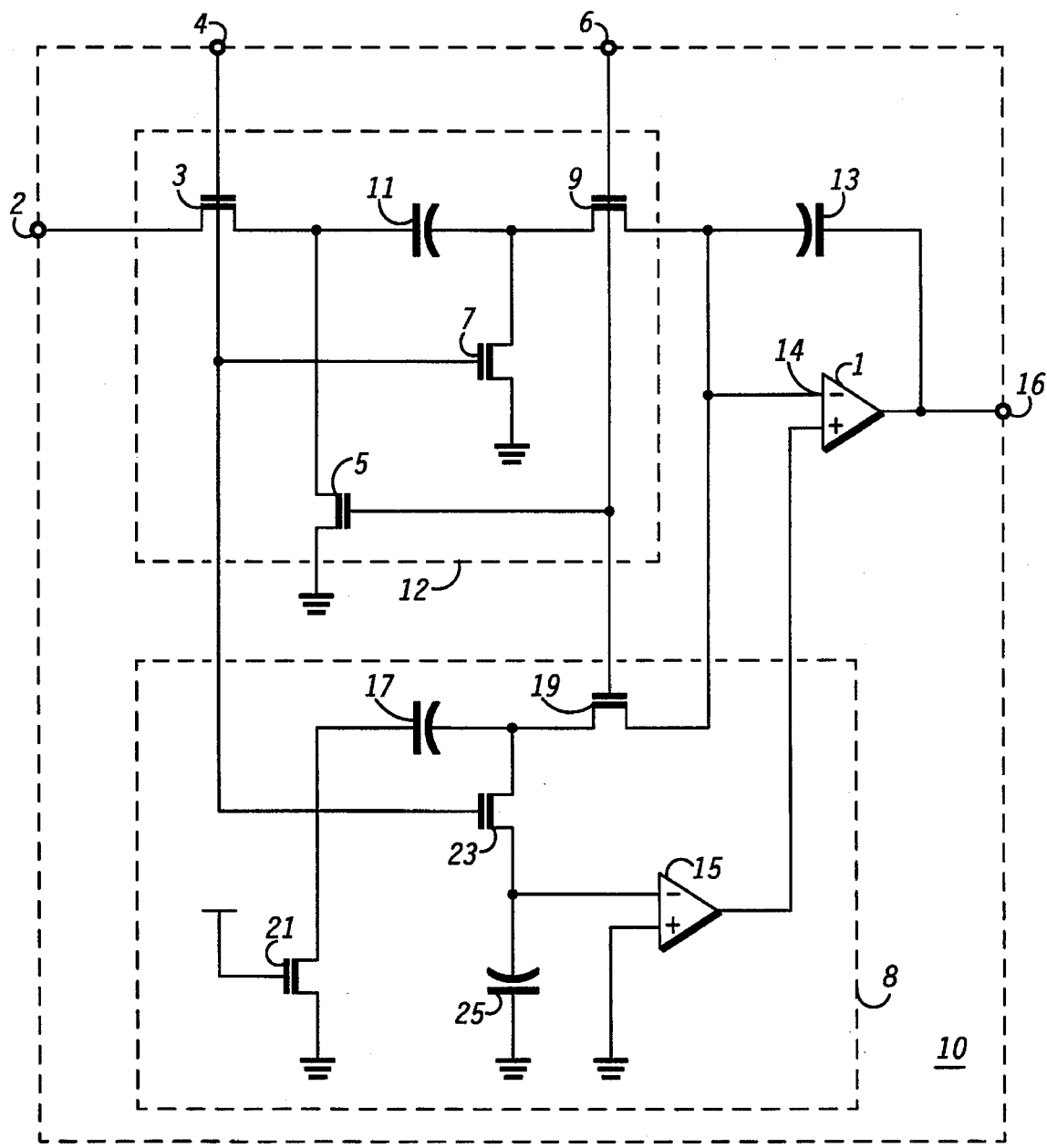

5,617,054

SWITCHED CAPACITOR VOLTAGE ERROR COMPENSATING CIRCUIT

FIELD OF THE INVENTION

This invention relates to compensating circuits and particularly though not exclusively to compensating circuits for use with switched capacitor circuits.

BACKGROUND OF THE INVENTION

In switched capacitor circuits an analogue switch is typically used to switch a capacitor. An op-amp is typically used to implement an integration step of the analogue switch.

Voltage spikes associated with the op-amp circuitry give rise to integration errors, the voltage spikes being sampled and aliased into low frequencies, where they can no longer be filtered out with a high frequency filter.

A known method to reduce the integration error due to voltage spikes is based on using a fully differential op-amp and a sampling circuit, which benefits from the fact that the majority of spikes are common mode and have a small differential component.

However, a problem with this arrangement is that for certain applications requiring high levels of oversampling such as sigma-delta converters and low-pass filters, the differential method cannot provide sufficient spike protection, giving rise to serious integration errors.

This invention seeks to provide a compensating circuit which mitigates the above mentioned disadvantages.

SUMMARY OF THE INVENTION

According to the present invention there is provided a compensating circuit for use with a switched capacitor arrangement, the arrangement including a switched capacitor and an op-amp having a first input coupled to the switched capacitor, a second input and an output, the circuit comprising, sampling means for sampling an error signal at the first input of the op-amp; and, amplifier means coupled to receive the sampled error signal and for providing a compensation signal in dependence upon the sampled error signal; wherein the compensation signal provides an offset signal for the second input of the op-amp, such that propagation of the error signal to the output of the op-amp is substantially reduced.

The circuit preferably includes storing means coupled between the sampling means and the amplifier means for storing the sampled error signal such that the sampled error signal is received by the amplifier means during sampling of the error signal. Preferably the storing means comprises two capacitors arranged in a charge sharing configuration.

The charged sharing configuration preferably allows transfer of error charge. Preferably the sampling means comprises a capacitor having the same time constant as the capacitor of the arrangement. The op-amp is a preferably a differential op-amp.

In this way, voltage spike protection is improved, reducing serious integration errors, especially in highly oversampled arrangements such as sigma-delta circuits.

BRIEF DESCRIPTION OF THE DRAWING

An exemplary embodiment of the invention will now be described with reference to the drawing of FIG. 1 which, shows a preferred embodiment of a compensating circuit incorporated with a switched capacitor circuit in accordance with the invention.

DETAILED DESCRIPTION OF PREFERRED EMBODIMENT

Referring to FIG. 1, there is shown a switched capacitor circuit 10, including a compensating circuit 8 arranged for compensating an input spike associated with an op-amp 1. The op-amp 1 has an inverting input 14, a non-inverting input and an output coupled to an output terminal 16. Switching transistors 3, 5, 7, 9 with capacitor 11 are interconnected to comprise a typical and well-known switched-capacitor arrangement 12, which transfers charge from an input signal received at a first input electrode 2 to the inverting input 14 of the op-amp 1.

The circuit is powered by a clock, consisting of two non-overlapped phase signals corresponding to phases PHI0 and PHI1. A first phase electrode 4 is coupled to receive a first phase signal corresponding to the first phase PHI0, for providing the first phase signal to base electrodes of the switching transistors 3 and 7. Similarly, a second phase electrode 6 is coupled to receive a second phase signal corresponding to the second phase PHI1, for providing the second phase signal to base electrodes of the switching transistors 5 and 9.

During the phase PHI0 switching transistors 3 and 7 are switched on (conducting) and capacitor 11 is charged from the input signal received at the input terminal 2. During the phase PHI1 the switching transistors 5 and 9 are switched on (conducting) and capacitor 11 is discharged, the charge being transferred to the inverting input 14 of the op-amp 1.

A feedback capacitor 13 is coupled between the output and the inverting input 14 of the op-amp 1.

In the ideal case the op-amp 1 input has a virtual ground potential, so the capacitor 11 discharges completely through the inverting input 14. However, in real mixed-signal systems the op-amp 1 is subject to substrate and supply spikes. These spikes change the value of the output signal of the op-amp 1. The output signal value change is re-presented to the inverting input 14 of the op-amp 1 through the feedback capacitor 13. Therefore the inverting input signal fluctuates with the spikes, deviating the input signal from the ideal virtual ground potential. Without feedback, the output spike would not be present at the input. However, the feedback capacitor 13 must be used in order to integrate the charge from the input signal.

In order to compensate for input spikes, the compensating circuit 8 includes a non-fedback op-amp 15 having non-inverting and inverting inputs and an output is coupled via its output to the non-inverting input of the op-amp 1. The op-amp 15 has a very low unity-gain bandwidth, so high frequency spikes does not change its input. Furthermore, since it has no feedback path, voltage spikes do not change its input potential.

A first electrode of a capacitor 17 is selectively coupled via a switching transistor 19 to the inverting input 14 of the op-amp I and is also selectively coupled via a switching transistor 23 to a capacitor 25 and to the inverting input of the non-fedback op-amp 15. A second electrode of the capacitor 17 is coupled to ground via a transistor 21.

During phase PHI1 the noisy voltage on the op-amp 1 inverting input 14 is sampled onto capacitor 17 through switching transistor 19. Transistor 21 is used to provide a matched time constant with the input path consisting of capacitor 11 and switching transistors 9 and 5. Due to the matching the sampled spike on the capacitor 17 is equal to the one sampled on the capacitor 11.

During phase PHI0 the switching transistor 23 is switched on (conducting) and capacitor 17 shares its charge with the capacitor 25. The capacitor 25 holds the input potential of the non-fedback op-amp 15 when the switching transistor 23 opens during the phase PHI1.

If the capacitor 17 samples a spike on the inverting input 14 of the op-amp 1, the voltage on the inverting input of the op-amp 15 changes. Since the op-amp 15 is very low-frequency its output changes gradually, causing a change the signal presented to the non-inverting input of the op-amp 1. In response, the feedback capacitor 13 dynamically changes the value of the signal at the inverting input 14 of the op-amp 1, reducing its low-frequency component in such a way that the sampled spike on the capacitor 17 and hence that on the capacitor 11 is reduced.

Since the op-amp 15 has to be a low-frequency one in order to provide circuit stability and be insensitive to spikes the circuit effectively reduces the low-frequency sampled (aliased) spike component. This is of particular benefit for switched-capacitor circuits when working with a large oversampling ratio, such as in sigma-delta converters and filters, switched-capacitor voltage references, etc.

It will be appreciated by a person skilled in the art that alternative embodiments to the one hereinbefore described are possible. For example, the switched capacitor arrangement 12 may be replaced by an alternative well known arrangement which substantially performs the same function. Similarly, the precise arrangements of the transistors and capacitors of the circuit 8 may be slightly altered while maintaining the required circuit functionality.

We claim:

1. A compensating circuit for use with a switched capacitor arrangement, the arrangement including a switched capacitor and an op-amp having an inverting input coupled to the switched capacitor, a non-inverting input and an output, the compensating circuit comprising:

sampling means for sampling an error signal at the inverting input of the op-amp, amplifier means coupled to receive the sampled error signal and for providing a compensation signal in dependence upon the sampled error signal, wherein the compensation signal provides an offset signal for the non-inverting input of the op-amp, such that propagation of the error signal to the output of the op-amp is substantially reduced.

2. The compensating circuit of claim 1 wherein the compensating circuit includes storing means coupled between the sampling means and the amplifier means for storing the sampled error signal such that the sampled error signal is received by the amplifier means during sampling of the error signal.

3. The compensating circuit of claim 2 wherein the sampling means and the storing means each comprise a capacitor, the two capacitors being arranged in a charge sharing configuration.

4. The compensating circuit of claim 3 wherein the charge sharing configuration allows transfer of error charge.

5. The compensating circuit of claim 1 wherein the capacitor of the sampling means and the switched capacitor of the arrangement have substantially the same time constant.

6. The compensating circuit of claim 1 wherein the op-amp is a differential op-amp.

* * * * *